United States Patent [19]

Freytsis et al.

[11] Patent Number: 4,899,059
[45] Date of Patent: Feb. 6, 1990

[54] DISK SCANNING APPARATUS FOR BATCH ION IMPLANTERS

[75] Inventors: Avrum Freytsis, Swampscott; Richard J. Hertel, Boxford; Eric L. Mears, Rockport, all of Mass.

[73] Assignee: Varian Associates, Inc., Palo Alto, Calif.

[21] Appl. No.: 366,202

[22] Filed: Jun. 9, 1989

Related U.S. Application Data

[63] Continuation of Ser. No. 195,729, May 18, 1988, abandoned.

[51] Int. Cl.$^4$ .............................................. H01J 37/20
[52] U.S. Cl. ................................ 250/492.2; 250/453.1
[58] Field of Search ............. 250/492.21, 492.2, 492.3, 250/453.1

[56] References Cited

U.S. PATENT DOCUMENTS

| | | | |
|---|---|---|---|
| 3,983,402 | 9/1976 | Arndt, Jr. et al. | 250/492 A |
| 4,035,655 | 7/1977 | Guernet et al. | 250/492 A |
| 4,228,358 | 10/1980 | Ryding | 250/457 |
| 4,229,655 | 10/1980 | Ryding | 250/400 |
| 4,234,797 | 11/1980 | Ryding | 250/492 B |
| 4,247,781 | 1/1981 | Bayer et al. | 250/492 A |
| 4,258,266 | 3/1981 | Robinson et al. | 250/492 A |
| 4,274,004 | 6/1981 | Kanai | 250/442 |
| 4,276,477 | 6/1981 | Enge | 250/398 |
| 4,399,365 | 8/1983 | Koike et al. | 250/492.2 |
| 4,599,516 | 7/1986 | Taya et al. | 250/443.1 |
| 4,634,931 | 1/1987 | Taya et al. | 315/111.81 |
| 4,672,210 | 6/1987 | Armstrong et al. | 250/492.2 |
| 4,733,091 | 3/1988 | Robinson et al. | 250/492.2 |
| 4,745,287 | 5/1988 | Turner | 250/492.2 |

FOREIGN PATENT DOCUMENTS 0178803 9/1985 European Pat. Off. .

Primary Examiner—Jack I. Berman
Attorney, Agent, or Firm—Stanley Z. Cole; Gerald M. Fisher; Terrence E. Dooher

[57] ABSTRACT

A mechanical scanning system for a batch ion implanter includes a disk for mounting wafers at sites near its periphery and a disk drive assembly for rotating the disk. The disk and the disk drive assembly are supported in an end station vacuum chamber by a scan arm which extends through a sealed opening in an access door. A scan drive assembly attached to the access door scans the scan arm and the disk in an arc-shaped path. Simultaneous rotation and scanning of the disk cause the ion beam to be distributed over the surfaces of the wafers mounted on the disk. A pivot drive assembly rotates the scan arm and the disk about a pivot axis between an implant position and a load/unload position. The implant angle can be changed without opening or venting the vacuum chamber by loosening the attachment of the scan drive assembly to the access door and rotating the scan drive assembly, the scan arm and the disk about the pivot axis. The access door can be moved on rails to an open position for access to the disk.

36 Claims, 12 Drawing Sheets

DISK SCANNING APPARATUS FOR BATCH ION IMPLANTERS

This application is a continuation of application Ser. No. 195,729 filed 5/18/88, now abandoned.

FIELD OF THE INVENTION

This invention relates to apparatus for vacuum processing of workpieces and, more particularly, to apparatus for mechanically scanning, or translating, a plurality of workpieces in two dimensions relative to an ion beam so that ions are uniformly distributed over the workpiece surface. The scanning system is intended primarily for ion implantation of semiconductor wafers, but is not limited to such use.

BACKGROUND OF THE INVENTION

Ion implantation has become a standard, commercially-accepted technique for introducing conductivity-altering impurities into semiconductor wafers. The desired impurity material is ionized in an ion source, the ions are accelerated to form an ion beam of prescribed energy, and the ion beam is directed at the surface of the semiconductor wafer. The energetic ions in the beam penetrate into the bulk of the semiconductor material and are embedded in the crystalline lattice of the semiconductor material to form a region of desired conductivity.

In commercial ion implanters, several factors are crucial in achieving an effective system. One crucial factor is throughput in terms of wafers processed per unit time. Wafer transfer time, implant time and downtime all contribute to the total processing time. In order to reduce the implant time, efforts are constantly made to increase the ion beam current applied to the semiconductor wafer while maintaining the wafer below a prescribed maximum temperature. Other crucial factors in ion implantation include dose accuracy and dose uniformity over the surface of the wafer, since semiconductor devices fabricated by ion implantation must have controlled and repeatable operating characteristics. Furthermore, minimizing particulate contamination is extremely important, since semiconductor devices with microminiature features are extremely susceptible to damage by such contamination.

Ion implanters have generally fallen into two major categories, serial and batch. In serial systems, wafers are processed one at a time. Since the wafer is continuously in the ion beam during implantation, the maximum ion beam current is limited. In batch systems, a number of semiconductor wafers are typically mounted on wafer mounting sites in an annular region near the periphery of a disk. The disk intercepts the ion beam in a small area of the annular region, and the disk is rotated so that all of the wafers successively intercept the ion beam. Since each individual wafer intercepts the ion beam for only a fraction of the disk revolution time, the average power applied to each wafer is relatively low. As a result, significantly higher ion beam currents can be utilized in batch systems than in serial systems. Since the ion beam is typically smaller in cross-section than the surface area of a wafer, it is necessary to provide additional movement, either of the rotating disk or of the beam, in order to uniformly distribute ions over the wafer surface.

In one prior art batch ion implanter, the ion beam is magnetically scanned in one direction, and disk rotation provides movement in a second direction. Such a system is disclosed in Enge U.S. Pat. No. 4,276,477 issued June 30, 1981. One disadvantage of magnetic beam scanning is that the required scan magnets are large and heavy.

A second approach to batch ion implantation has been to utilize a stationary ion beam and mechanical scanning of the wafers in two dimensions. However, two-dimensional mechanical scanning in vacuum is difficult because the drive mechanisms are preferably located outside the vacuum chamber for operational reasons and to prevent contamination generated by moving mechanical parts. A two-dimensional mechanical scan system for ion implantation is disclosed in Ardnt, Jr. et al. U.S. Pat. No. 3,983,402 issued Sept. 28, 1976. The disclosed system utilizes a pair of bellows for transmitting reciprocating motion into the vacuum chamber. Another prior art system that utilizes a rotating disk and a sliding seal, or linear air bearing, to provide reciprocating motion of the rotating disk relative to the ion beam is described in Ryding U.S. Pat. No. 4,229,655 issued Oct. 21, 1980. Still another prior system for providing two-dimensional motion is described in European Patent Application No. 178,803 published Apr. 23, 1986. A rotating disk is carried on an arm that precesses back and forth in an arc within the vacuum chamber.

A further complication in batch ion implantation systems is that provision must be made for loading wafers onto the disk prior to implantation and for removing wafers from the disk after implantation is complete. Wafer exchange is preferably performed automatically in a manner which reduces the possibility of particulate contamination to a minimum. In one wafer loading technique, the disk is flipped or pivoted from a more-or-less vertical orientation during implantation to a horizontal orientation for loading and unloading of wafers. This technique is utilized in the Varian Model 160-10 Ion Implanter and is shown in U.S. Pat. Nos. 4,276,477; 3,983,402; and 4,229,655. In another technique disclosed in European Patent Application No. 178,803, the disk is maintained in the implant position during loading and unloading of wafers.

It is desirable during ion implantation of semiconductor wafers to control the angle of incidence of the ion beam on the wafer surface, since the ion penetration depth is a function of the angle-of-incidence (implant angle). The variation in penetration depth with angle-of-incidence, commonly known as "channeling," depends on the orientation of the crystal axes of the semiconductor wafer relative to the ion beam. Channeling depends not only on the angle-of-incidence, but also the crystal structure of the semiconductor wafer. To control channeling, it is customary to utilize a prescribed implant angle for a given crystal structure and crystal orientation. It is therefore necessary that ion implantation systems have the capability to vary the implant angle. Tapered heat sink inserts positioned underneath each wafer are disclosed in European Pat. application No. 178,803. In order to alter the angle of implant, it is necessary to vent the vacuum chamber to atmosphere, to change the heat sink insert at each wafer location and then to vacuum pump the chamber back to high vacuum.

Prior art systems have utilized both peripheral clamping and centrifugal clamping of wafers during ion implantation. Peripheral clamping with a clamping ring is generally satisfactory, but an annular portion of the wafer near its peripheral edge is shadowed by the clamping ring, thus rendering that portion of the wafer useless. Centrifugal clamping exposes the entire wafer surface for treatment, but requires that the disk be designed so that sufficient centrifugal force for clamping and wafer cooling is applied to the wafer.

It is a general object of the present invention to provide improved ion implantation systems.

It is another object of the present invention to provide improved apparatus for workpiece translation in a vacuum chamber.

It is another object of the present invention to provide apparatus for workpiece translation in a vacuum chamber with drive mechanisms isolated from the vacuum chamber.

It is still another object of the present invention to provide apparatus for workpiece translation in two dimensions relative to a stationary beam.

It is yet another object of the present invention to provide apparatus for two-dimensional workpiece translation that is compatible with a horizontal wafer transfer system.

It is still another object of the present invention to provide apparatus for workpiece translation in a vacuum chamber wherein the angle-of-incidence of an ion beam on a workpiece can be changed without opening or venting the vacuum chamber.

It is a further object of the present invention to provide apparatus for workpiece translation in a vacuum chamber wherein the angle-of-incidence of an ion beam on a workpiece can be changed without readjusting the system which transfers workpieces to and from the translation apparatus.

It is a further object of the present invention to provide apparatus for workpiece translation in a vacuum chamber wherein the translation apparatus can easily be accessed.

SUMMARY OF THE INVENTION

According to the present invention, these and other objects and advantages are achieved in apparatus for workpiece translation in an ion beam treatment system. The workpiece translation apparatus is typically utilized in a system for ion implantation of semiconductor wafers. The apparatus comprises a vacuum envelope defining a vacuum chamber, means for generating an ion beam, a disk including a plurality of workpiece mounting sites, the disk being positioned within the vacuum chamber so that one of the workpiece mounting sites intercepts the ion beam, disk drive means for rotating the disk about a disk rotation axis so that the workpiece mounting sites successively intercept the ion beam, scan arm means for supporting the disk and the disk drive means within the vacuum chamber, the scan arm means extending through the vacuum envelope and being mounted for movement around a scan axis, scan drive means for rotating the scan arm means about the scan axis so that the disk and the disk drive means move along an arc-shaped path in the vacuum chamber, and pivot drive means for pivoting the scan arm means, the disk drive means and the disk about a pivot axis to and between a treatment position and a load/unload position.

According to one feature of the invention, each of the workpiece mounting sites includes a generally planar mounting surface oriented at a predetermined angle relative to a plane perpendicular to the disk rotation axis, and the scan axis is oriented at the same predetermined angle relative to the disk rotation axis so that the scan axis is perpendicular to the workpiece mounting surface of that workpiece mounting site that intercepts the ion beam. As a result, the workpiece intercepts the ion beam at a fixed point along the ion beam axis during scanning.

The vacuum envelope preferably includes an access door, and the apparatus includes scan support means attached to the access door for supporting the scan drive means so that the scan drive means, the scan arm means and the disk are carried by the access door to and between a closed, operational position and an open, access position. The access door is preferably carried on a pair of rails between the operational position and the access position.

In a preferred embodiment, the disk drive means is positioned within the vacuum chamber and is supported by the scan arm means. The disk drive means includes a sealed disk drive housing enclosing a disk drive motor. The scan arm means includes a hollow portion for coupling the interior of the disk drive housing to the external atmosphere so that the interior of the disk drive housing is maintained at ambient pressure. As a result, particulate contamination which may be generated by the disk drive motor and associated components is isolated from the vacuum chamber.

The scan drive means preferably comprises a scan drive housing connected to the scan arm means, a ball screw assembly mounted on the scan drive housing, the ball screw assembly including a ball screw having one end in abutting contact with the scan support means and a nut mounted for rotational movement in the scan drive housing, and a scan drive motor coupled to the nut for advancing the nut on the ball screw. When the scan drive motor is energized, the scan drive means and the scan arm means pivot around the scan axis.

The scan arm means preferably comprises a scan arm housing on the pivot axis and a scan arm that is coaxial with the scan arm housing. The scan arm is mounted in bearings for rotation about the pivot axis relative to the scan arm housing. The pivot drive means comprises a pivot drive motor and means for coupling the pivot drive motor to the scan arm. When the pivot drive motor is energized, the scan arm and the disk pivot around the pivot axis.

According to another aspect of the invention, the workpiece translation apparatus includes implant angle adjustment means for changing the angle of incidence of the ion beam on the workpiece. The angle adjustment means includes means for rotating the disk and the scan arm means around the pivot axis without opening or venting the vacuum chamber. The scan support means is mounted to the access door with a plurality of spring-loaded clamps. When the spring-loaded clamps are loosened, the scan support means can be rotated about the pivot axis, thereby changing the implant angle while maintaining the desired orientation between the scan axis and the disk rotation axis. The implant angle adjustment is accomplished without the necessity for venting or opening the vacuum chamber. Furthermore, the wafer transfer system does not require readjustment after the implant angle is changed.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
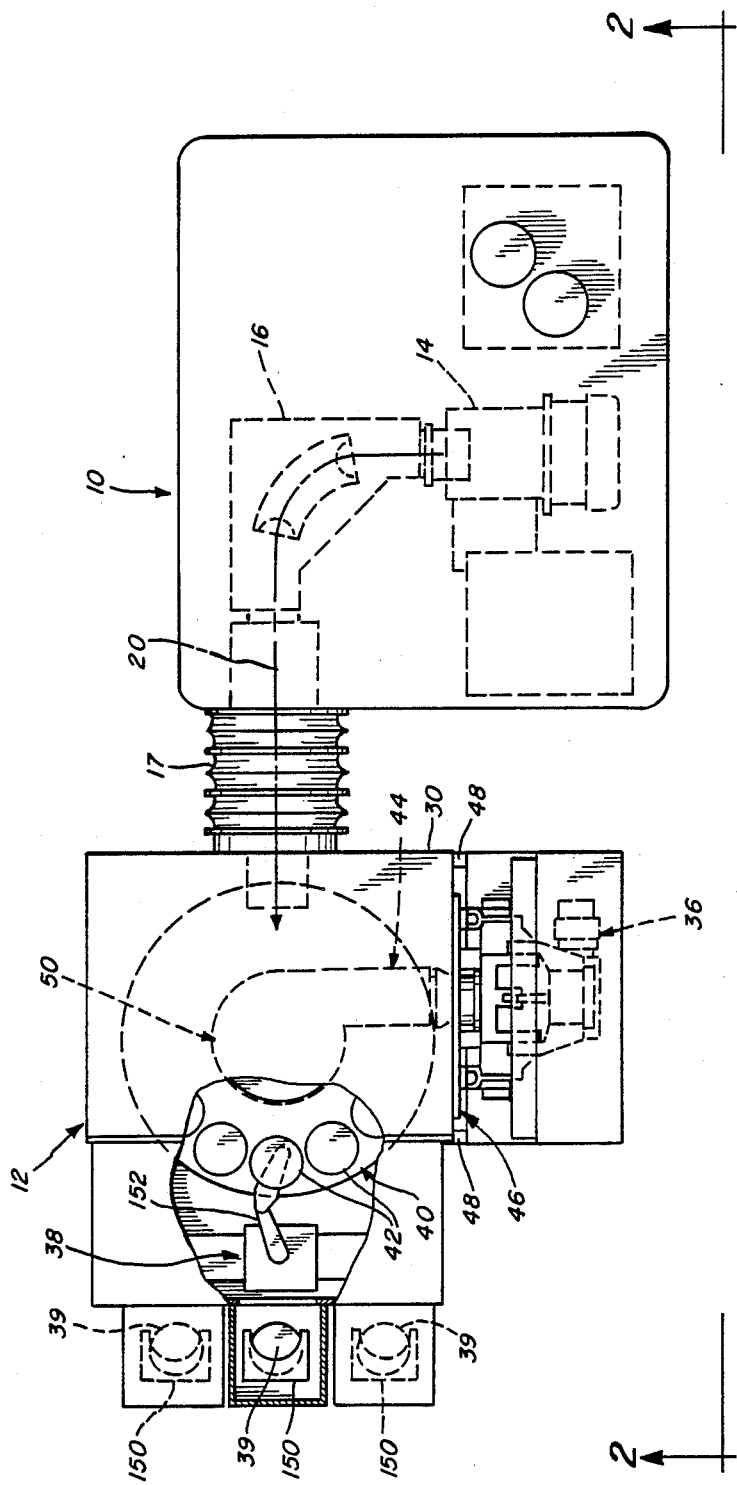
FIG. 1 is a top plan view, partially broken away, of an ion implantation system with the disk shown in a horizontal position for loading and unloading of wafers.
Figure 2:
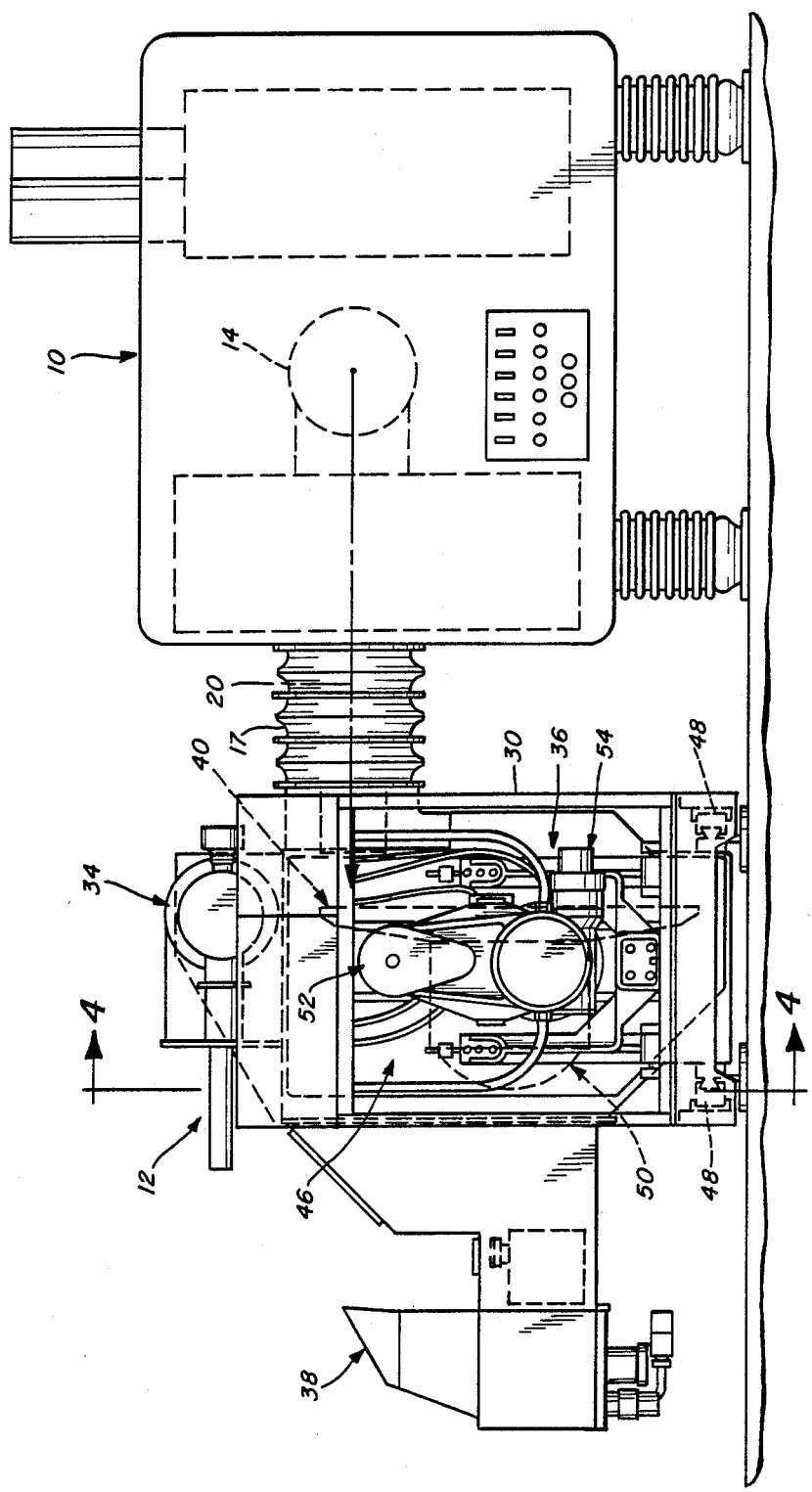
FIG. 2 is an elevation view of the ion implantation system of FIG. 1, as seen along the line 2—2 of FIG. 1, with the disk shown in an implant position.

An ion implantation system shown in FIGS. 1 and 2 includes a terminal module 10 and an end station module 12 The terminal module 10 includes an ion source 14 for ionizing a source material and forming an ion beam 20, a mass analyzer 16 for separating undesired species from ion beam 20, and an accelerator 17 for accelerating the ion beam 20 to energies in the range between 2 keV and 200 keV. The ion source 14 may produce ion beam currents up to 30 milliamps. The ion beam 20 is fixed in position along a prescribed axis and is directed into the end station module 12.

The end station module 12 includes a high vacuum chamber 30. The vacuum chamber 30 is maintained at high vacuum by a vacuum pumping system 34. The end station module 12 includes scanning apparatus 36 in accordance with the present invention for translating, or scanning, of workpieces, usually semiconductor wafers, in two dimensions relative to the ion beam 20. The end station module 12 also includes a wafer transfer system 38 for loading semiconductor wafers 39 onto the scanning apparatus 36 prior to ion implantation and for unloading the wafers from the scanning apparatus 36 after ion implantation. The region surrounding ion beam 20 from ion source 14 to wafers 39 is maintained at high vacuum during operation.

Figure 3:
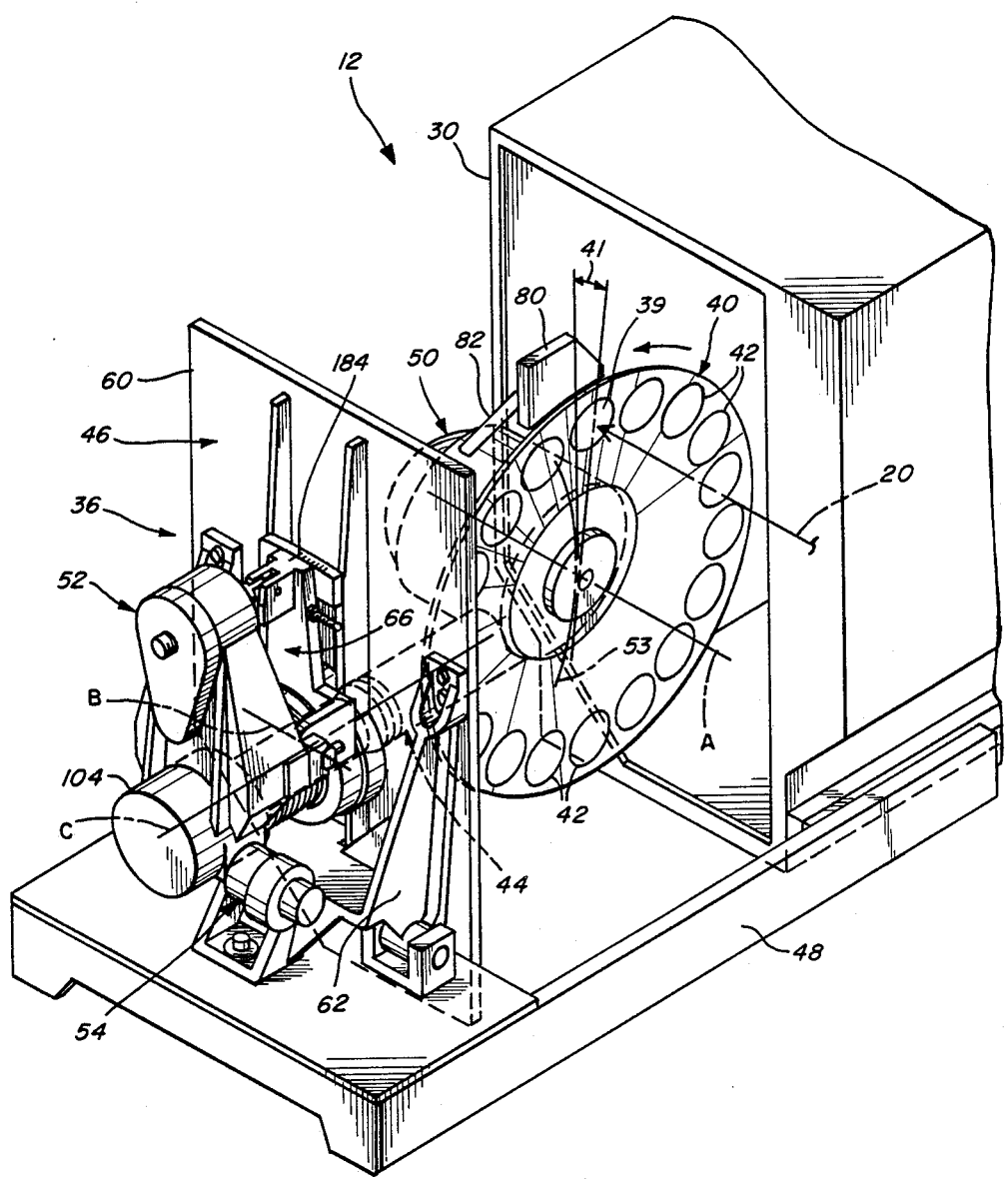
FIG. 3 is a perspective view of the scanning apparatus of the present invention with the disk access door open.

A perspective view of the scanning apparatus 36 is shown in FIG. 3. The scanning apparatus 36 includes a disk 40 having a plurality of wafer mounting sites 42 located in an annular region near its outer periphery. The disk 40 is mounted to a disk drive assembly 50. The disk 40 and the disk drive assembly 50 are supported by a scan arm assembly 44 which is mounted to an access door assembly 46. The access door assembly 46 is supported by a pair of rails 48 which extend under vacuum chamber 30 in a direction transverse to ion beam 20. The access door assembly 46, the disk 40, the disk drive assembly 50 and the scan arm assembly 44 can be moved outwardly on rails 48 for access to these elements.

The disk 40 is caused to rotate about a disk rotation axis A through its center by the disk drive assembly 50. The disk 40, the disk drive assembly 50 and the scan arm assembly 44 are caused by a scan drive assembly 52 to reciprocate, or scan, in an arc 53 about a scan axis B. The rotation of disk 40 about axis A and the scanning of scan arm assembly 44 about axis B provide a composite two-dimensional motion relative to ion beam 20 so that the surface of each wafer mounted on disk 40 receives a uniform ion dosage. The disk 40 is also movable between an approximately vertical ion implant position (shown in solid lines in FIG. 10) and an approximately horizontal load/unload position (shown in phantom in FIG. 10). The disk 40 and the disk drive assembly 50 are caused to pivot about a pivot axis C between the implant position and the load/unload position by a pivot drive assembly 54. In addition to the above movements, the disk 40, the disk drive assembly 50, the scan arm assembly 44 and the scan drive assembly 52 can be manually rotated about the axis C in order to change the implant angle, as described hereinafter.

Figure 4:
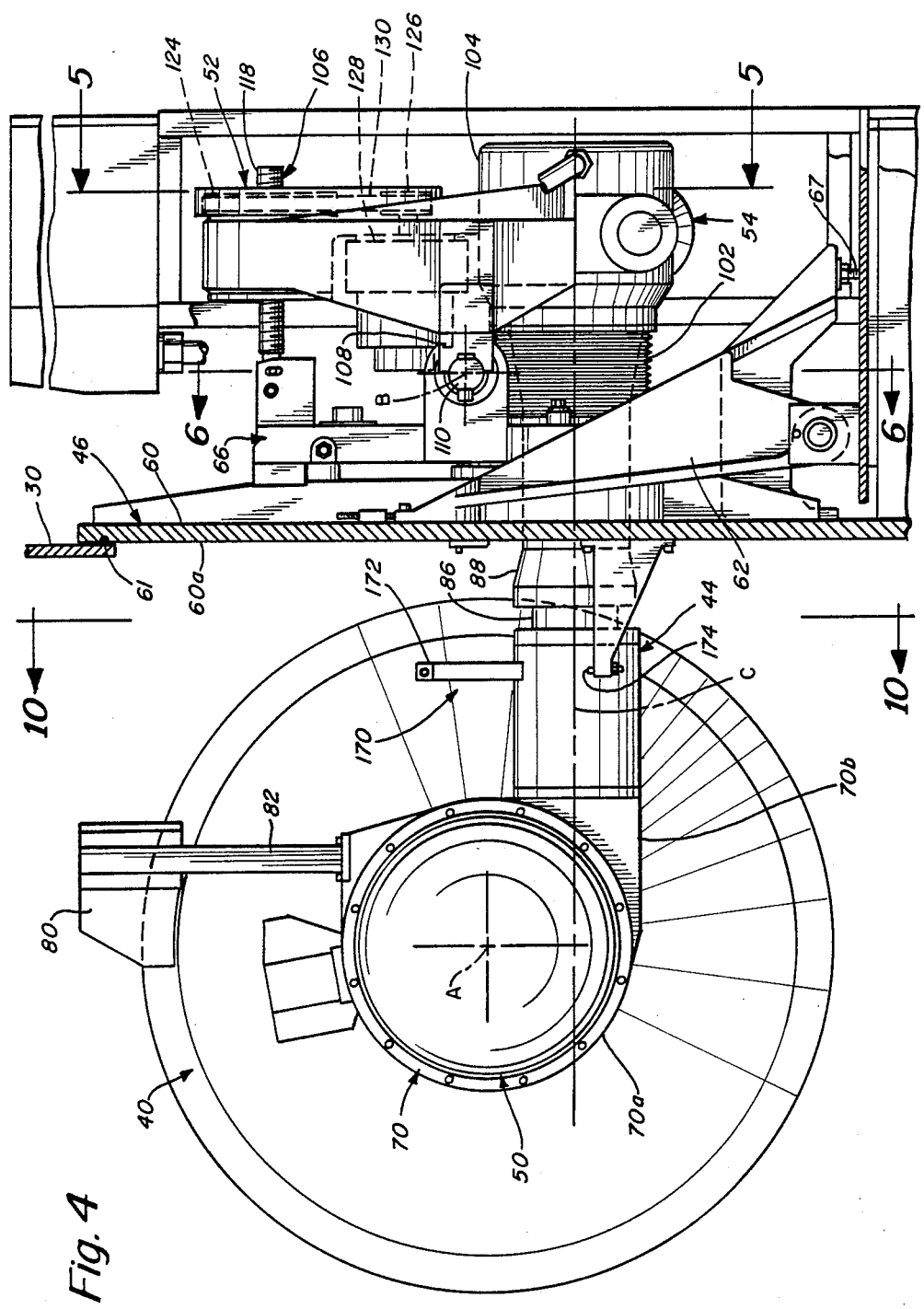
FIG. 4 is a cross-sectional view of the scanning apparatus taken along line 4—4 of FIG. 2.
Figure 6:
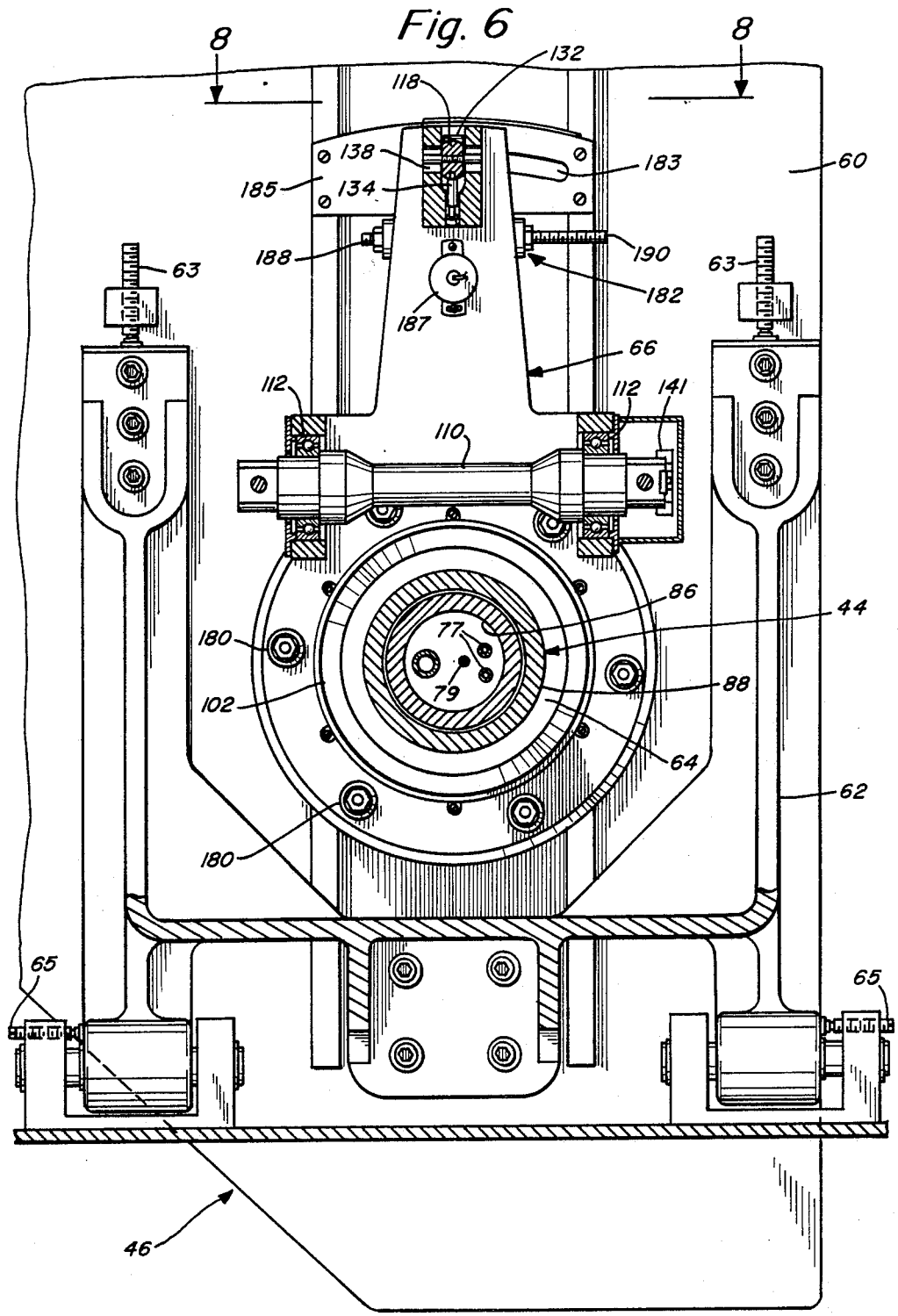
FIG. 6 is a cross-sectional view of the scanning apparatus taken along the line 6—6 of FIG. 4 showing the access door assembly and the implant angle adjustment.

The access door assembly 46, as shown in FIGS. 3, 4 and 6, includes a disk access door 60 having an inside surface 60a that is sealed vacuum tight to an opening in vacuum chamber 30. An elastomer ring 61 is used to seal the door 60 to vacuum chamber 30. A door support 62 is coupled between the outside surface of access door 60 and rails 48 in order to strengthen and stabilize the access door 60. The access door assembly 46 further includes vertical adjustment screws 63 for adjusting the vertical position of door 60 on rails 48, horizontal adjustment screws 65 for adjusting the horizontal position of the door 60 on rails 48 and a rotational adjustment 67 for door 60.

As described hereinafter, the disk 40, the disk drive assembly 50, the scan arm assembly 44 and the scan drive assembly 52 are supported by the access door 60. The access door 60 further includes an opening 64 through which the scan arm assembly 44 passes. The disk end, or inner end, of the scan arm assembly 44 is inside vacuum chamber 30, while the drive end, or outer end, thereof is located outside the vacuum chamber 30. A scan support 66 is mounted to the outside of access door 60 in a manner which permits rotation of the scanning apparatus 36 about axis C, as described hereinafter.

Figure 10:
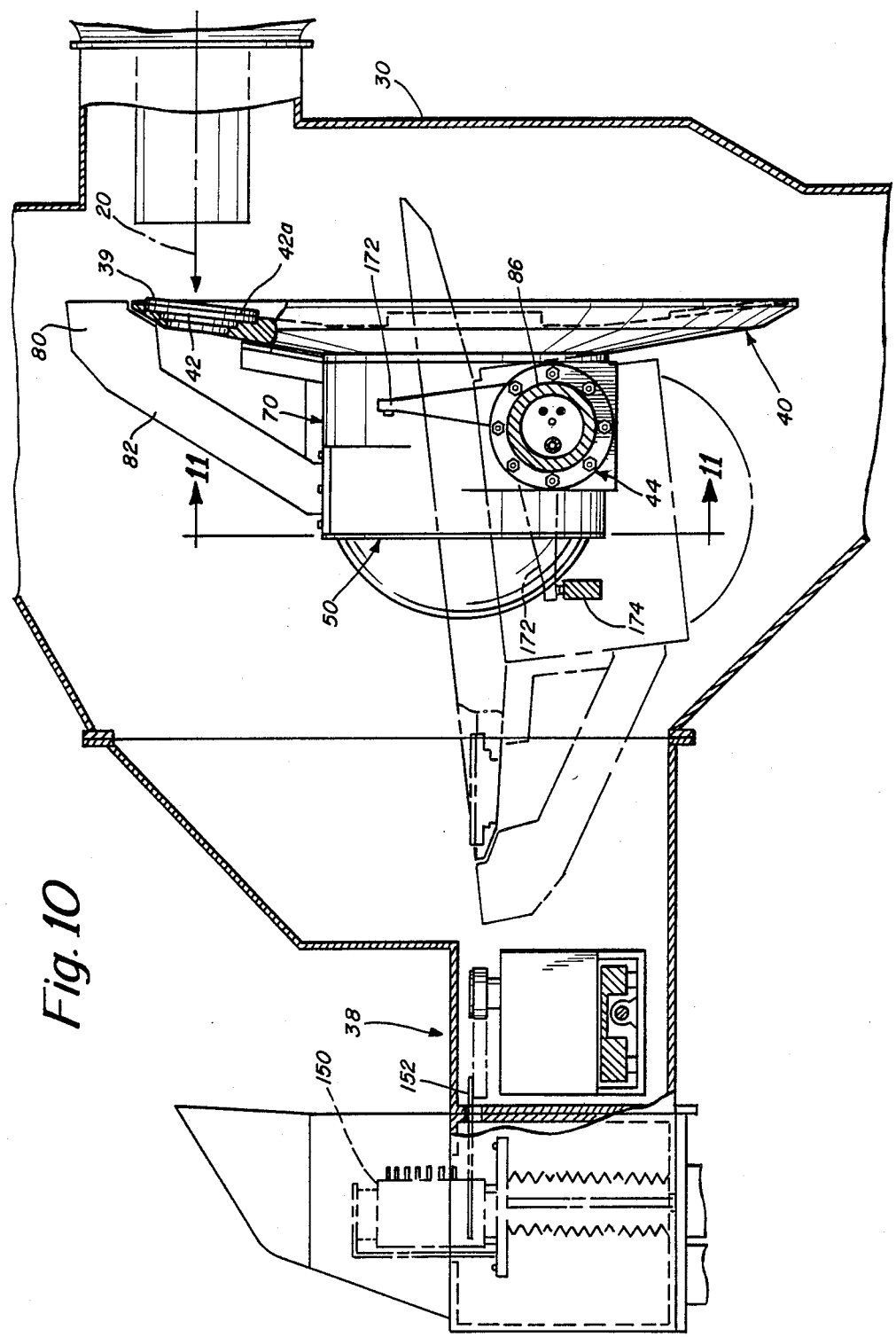
FIG. 10 is a cross-sectional view of the scanning apparatus taken along the line 10—10 of FIG. 4, showing the disk in the implant position in solid lines and in the load/unload position in phantom lines.
Figure 12:
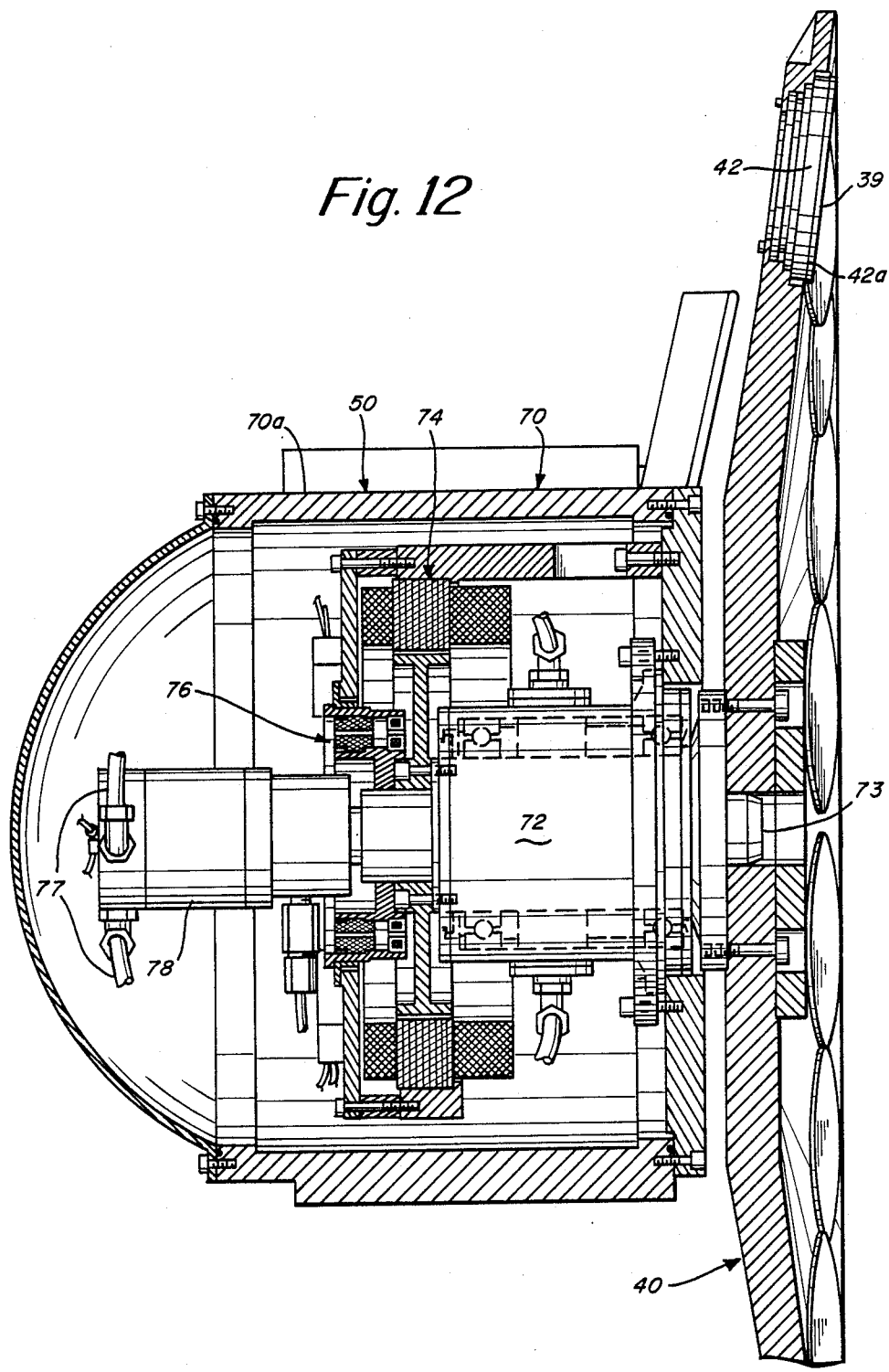
FIG. 12 is a cross-sectional view of the disk drive assembly taken along the lines 12—12 of FIG. 11.
Figure 13:
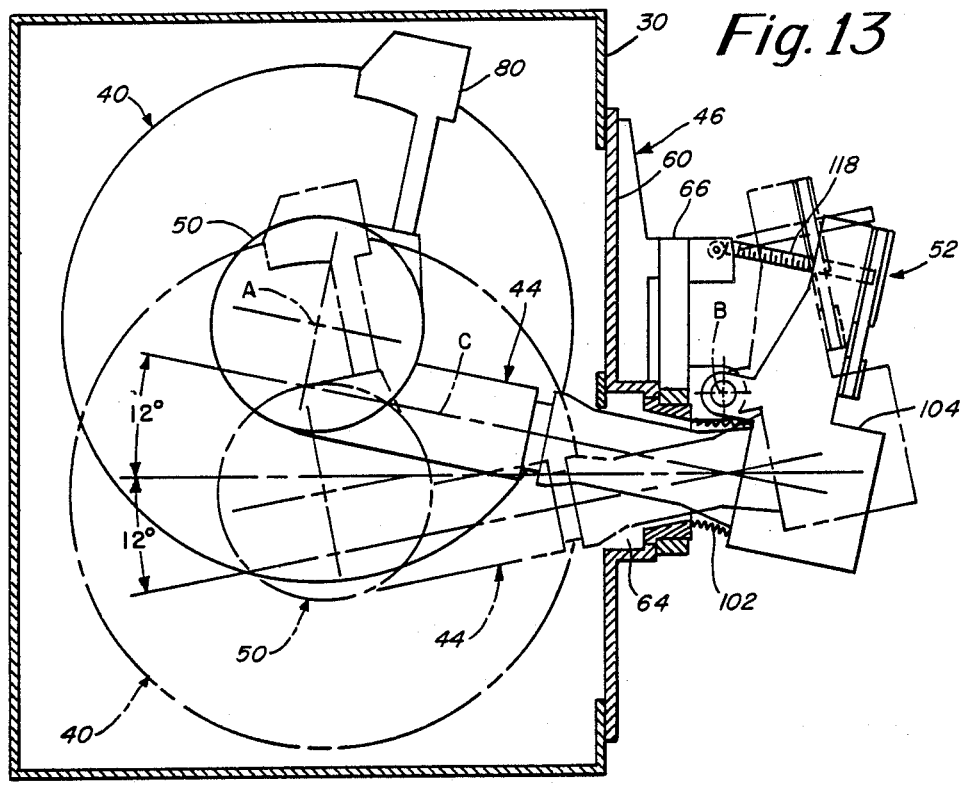
FIG. 13 is a schematic view of the scanning apparatus that illustrates scan arm operation.

As described hereinabove, wafer mounting sites 42 are located in an annular region near the periphery of disk 40, as shown in FIGS. 3, 10 and 12. Each wafer mounting site 42 includes a flat surface 42a on which a wafer is mounted and which acts as a heat sink for energy transferred to the wafer by the ion beam 20. The wafer mounting surfaces 42a are each tilted at a prescribed angle 41, typically seven degrees, relative to the plane of disk 40. As a result, when the disk 40 rotates about the axis A, which is perpendicular to the disk plane, centrifugal force presses the wafers against the respective mounting surfaces 42a. Each wafer mounting site 42 is preferably cooled by water circulated through the scan arm assembly 44 and the disk drive assembly 50.

Figure 11:
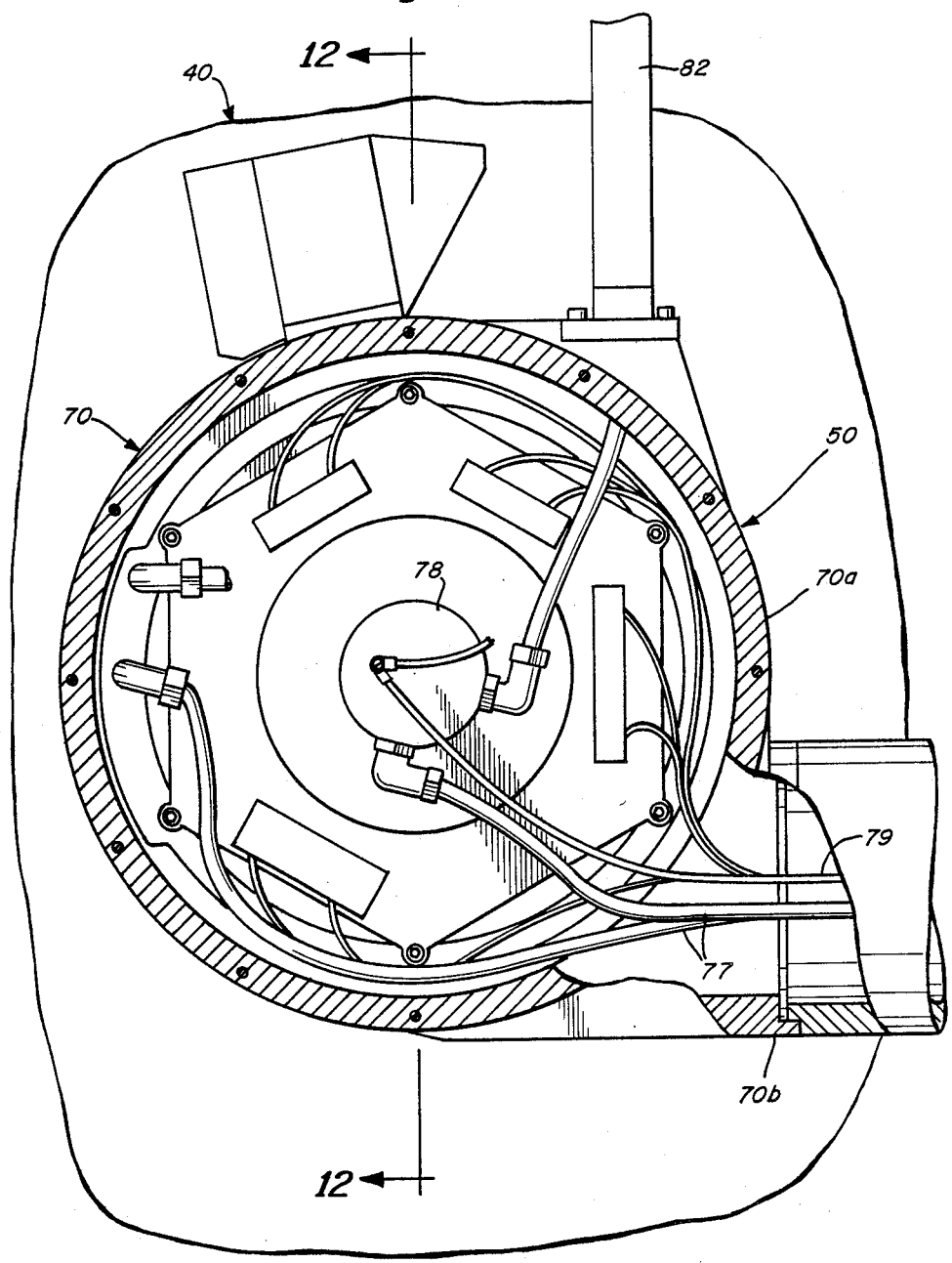
FIG. 11 is a cross-sectional view of the disk drive assembly taken along the lines 11—11 of FIG. 10.

The disk 40 is mounted at its hub to the disk drive assembly 50. As shown in FIGS. 11 and 12, the disk drive assembly 50 includes a disk drive housing 70 that is sealed vacuum-tight so that the interior thereof can be maintained at atmospheric pressure. The disk drive housing 70 contains a rotary vacuum feedthrough 72, such as a magnetic fluid type, that transmits rotary motion and cooling water from the interior of the disk drive housing 70 into the vacuum chamber 30. The hub of the disk 40 is coupled to a shaft 73 of the rotary vacuum feedthrough 72 in the vacuum chamber 30. A disk drive motor 74 is coupled directly to the shaft 73 of the rotary vacuum feedthrough 72 within the disk drive housing 70. The disk drive motor 74 can be an a.c. frameless torque ring motor. Also coupled to the shaft 73 are a resolver 76 for monitoring the angular position of the disk 40 and a rotary union 78 for coupling cooling water to the wafer mounting sites 42. The cooling passages through disk 40 are omitted from the drawing since they form no part of the present invention.

The scan arm assembly 44 has a hollow, sealed interior that connects the interior of the disk drive housing 70 to the external atmosphere. Hoses 77 for cooling water and electrical cables 79 for carrying power to disk drive motor 74 and signals to resolver 76 pass through the scan arm assembly 44. By sealing the interior of disk drive housing 70, contaminants generated by the disk drive motor 74 and the other moving parts of the disk drive assembly 50 are prevented from entering the vacuum chamber 30 where they could contaminate the semiconductor wafers being implanted. A water-cooled spillover cup 80 is supported from the disk drive housing 70 by a pipe 82. The spillover cup 80 is positioned to collect any portion of the ion beam 20 that bypasses the edge of disk 40.

Figure 7:
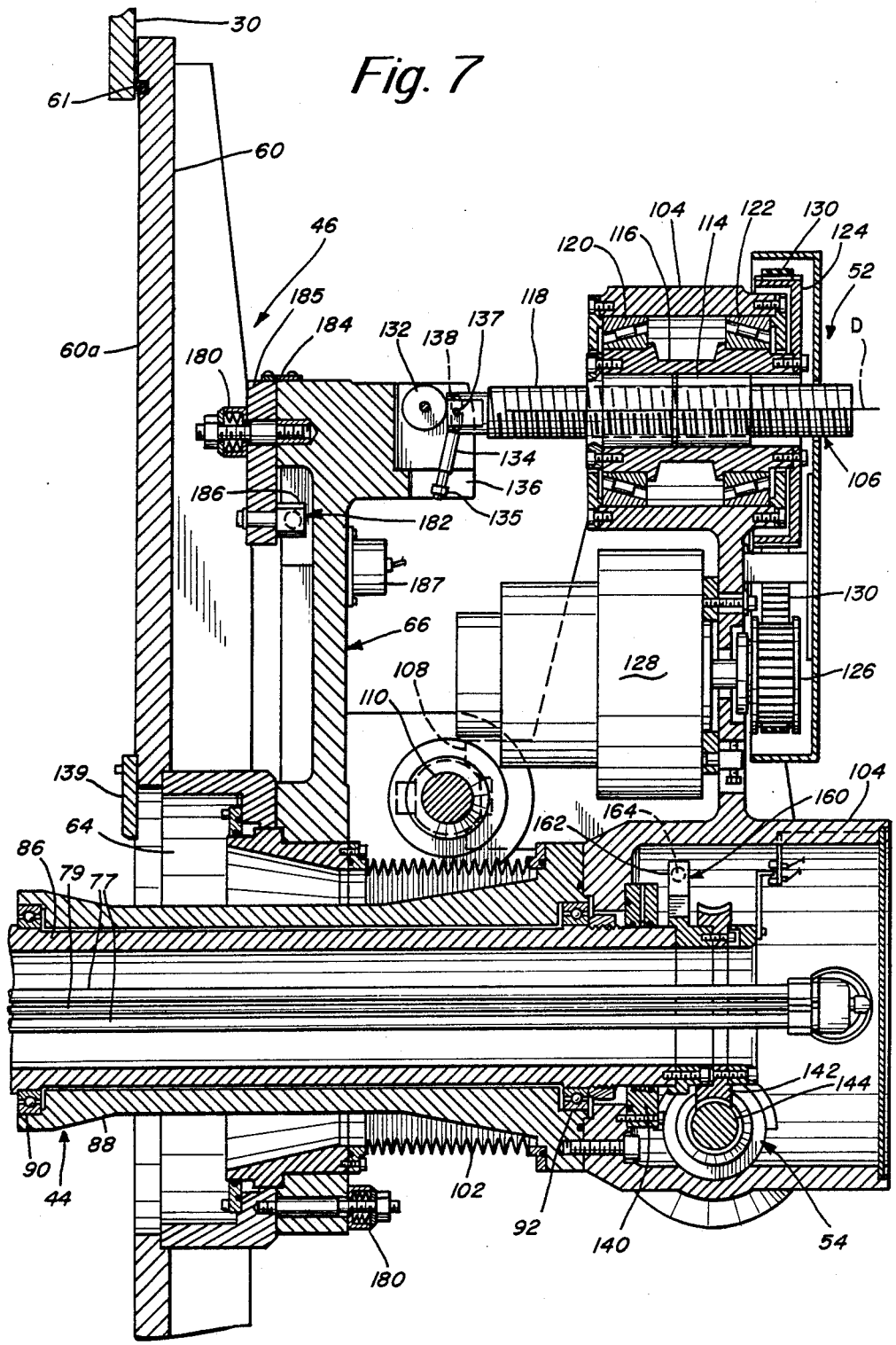
FIG. 7 is a cross-sectional view of the scanning apparatus taken along the line 7—7 of FIG. 5 showing the scan drive assembly.

The disk drive housing 70 includes a first hollow portion 70a coaxial with disk rotation axis A and a second hollow portion 70b extending from hollow portion 70a and coaxial with pivot axis C. As shown in FIGS. 4 and 7, the scan arm assembly 44 includes a scan arm 86 that is sealed to and supports the second hollow portion 70b and a scan arm housing 88. The scan arm 86 is mounted in the scan arm housing 88 with ball bearings 90, 92 so that the scan arm 86 can be rotated about axis C relative to scan arm housing 88. The scan arm 86 and the scan arm housing 88 extend through opening 64 in disk access door 60. The opening 64 is sealed by a bellows 102 that is coupled at one end to scan arm housing 88 and is coupled at the other end to scan support 66. The bellows 102 permits movement of the scan arm assembly 44 relative to access door 60 while maintaining high vacuum in chamber 30. The scan arm housing 88 is coupled at the end outside the vacuum chamber 30 to the scan drive assembly 52.

Figure 5:
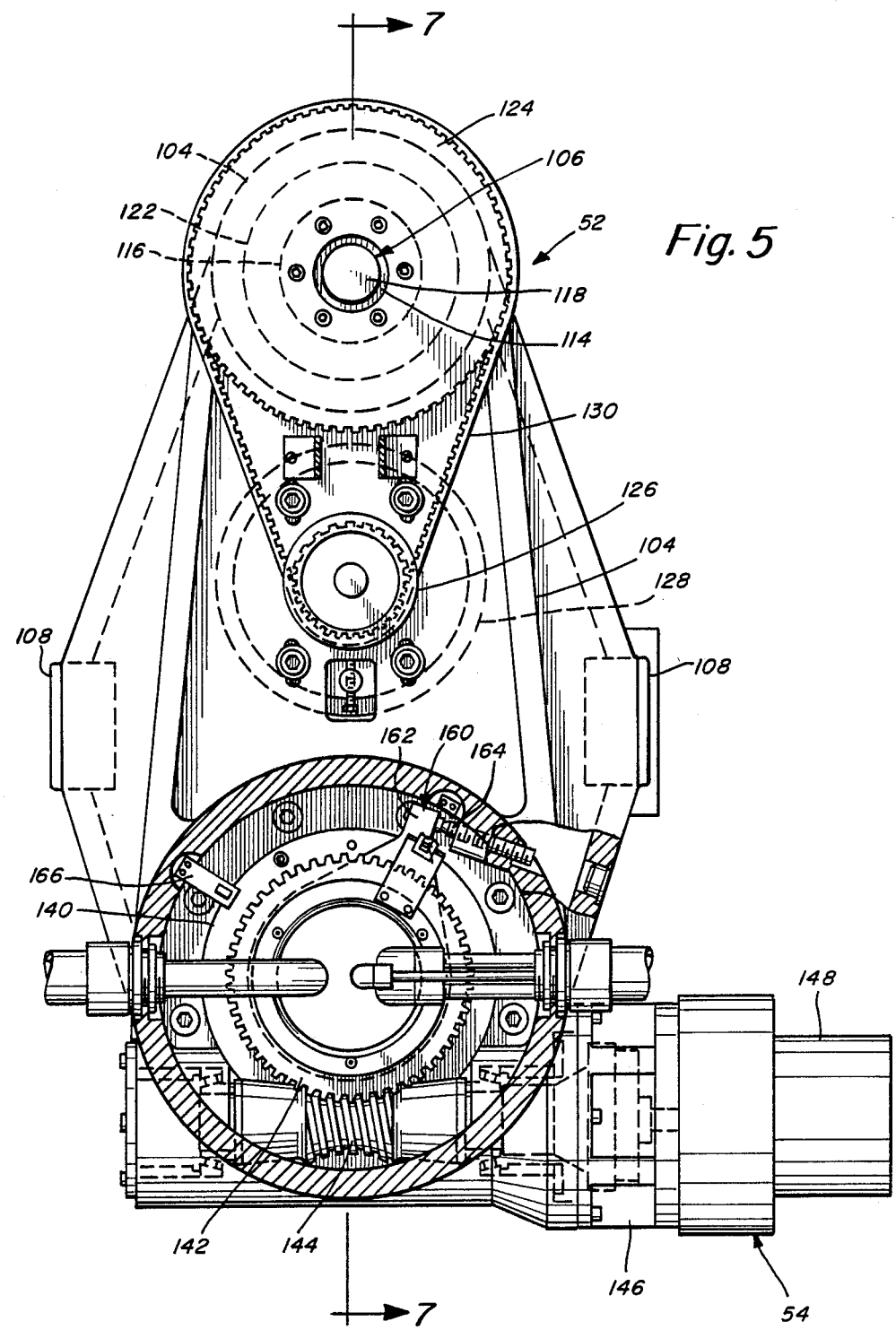
FIG. 5 is a cross-sectional view of the scanning apparatus taken along the line 5—5 of FIG. 4 showing the scan drive assembly and the pivot drive assembly.

The scan drive assembly 52, as shown in FIGS. 4, 5 and 7, includes a scan drive housing 104 with a lower portion coupled to scan arm housing 88. The scan drive housing 104 extends upwardly from the scan arm housing 88 and provides means for mounting a ball screw assembly 106 in spaced-apart relationship to scan arm housing 88. The ball screw assembly 106 is mounted with an axis D parallel to and spaced apart from pivot axis C. The scan drive housing 104 further includes a pair of aligned V-blocks 108 positioned for engagement with a scan shaft 110 that is mounted to scan support 66 by ball bearings 112 (see FIG. 6) to permit rotation about scan axis B. The scan arm assembly 44 and the scan drive assembly 52 pivot about axis B on scan shaft 110 by operation of the ball screw assembly 106, as described hereinafter.

The ball screw assembly 106 includes a nut 114 mounted in a sleeve 116. A ball screw 118 extends through the nut 114. The nut 114 and sleeve 116 are mounted to scan drive housing 104 by means of bearings 120, 122 which permit rotation of nut 114 about axis D. A pulley 124 is attached to the sleeve 116, and a pulley 126 is attached to the shaft of a scan motor 128. The scan motor 128 is mounted to scan drive housing 104, and the pulleys 124 and 126 are interconnected by a timing belt 130. When scan motor 128 is energized, pulley 124, sleeve 116 and nut 114 are caused to rotate.

Figure 8:
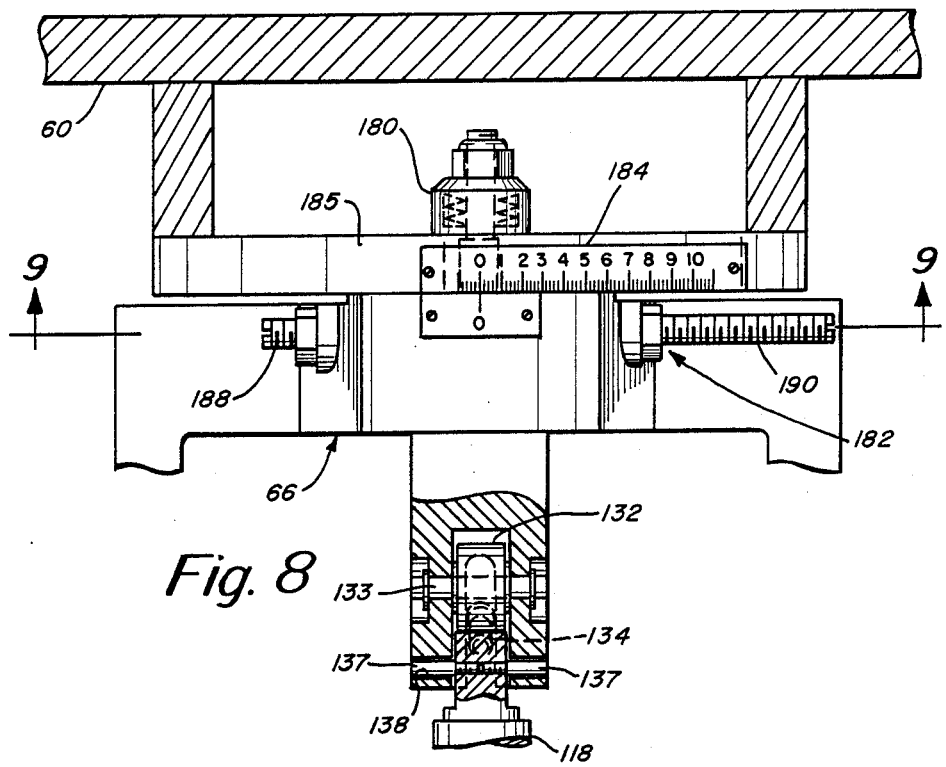
FIG. 8 is a partial cross-sectional view of the scanning apparatus taken along the line 8—8 of FIG. 6 showing the implant angle adjustment.

One end of ball screw 118 bears against a roller 132 that is rotatably mounted to scan support 66 by a pin 133. The ball screw 118 is also coupled by an antirotation pin 134 to scan support 66. A roller 135 attached to antirotation pin 134 is movable in an elongated, narrow slot 136 in scan support 66. The roller 132 permits slight movement of ball screw 118 transverse to axis D when the scan motor 128 is in operation. As shown in FIGS. 7 and 8, pins 137 are attached to ball screw 118. The pins 137, which are movable in elongated slots 138, do not function during normal operation. When the disk 40 is removed for service or exchange of disks, the pins 137 hold the scan drive assembly 52 in position and prevent it from rotating about axis B, due to the change in weight.

The weight of disk drive assembly 50 and disk 40 causes the scan arm assembly 44 to pivot downwardly about scan axis B and brings ball screw 118 into contact with roller 132. As a result, ball screw 118 remains in a substantially stationary axial position when the scan motor 128 is in operation. When scan motor 128 is energized, nut 114 rotates on stationary ball screw 118 and moves along axis D, thereby causing the scan arm assembly 44, the disk 40, the disk drive assembly 50 and the scan drive assembly 52 to rotate on scan shaft 110.

The rotation of the scan arm assembly 44 about scan shaft 110 is typically about ±12° for large wafers and is less for small wafers. A stop 139 (FIG. 7) mounted to door 60 limits the upward travel of scan arm assembly 44. In order to provide uniform distribution of the ion beam 20 over the wafer surface, the scan speed is controlled such that $dR/dt$ is proportional to $1/R$, where R is the distance from the disk axis A to the beam 20 in a direction perpendicular to the disk axis A.

Sensing switches 141 (FIG. 6) sense the rotational position of the scan arm assembly 44 about axis B. The sensing switches 141 sense the upper and lower limits of the scan and also sense the horizontal position of the scan arm assembly 44 in which the disk 40 is pivoted between the implant position and the load/unload position.

Pivot drive assembly 54 is mounted in the scan drive housing 104 adjacent the outer end of scan arm 86, as shown in FIGS. 5 and 7. A rotary vacuum seal 140, typically including two O-rings with an oil seal between them, permits rotary motion of scan arm 86 about axis C to be transmitted into vacuum chamber 30 while insuring that high vacuum is maintained. A worm gear 142 is attached to the scan arm 86 near its outer end. A worm 144 interengages with the worm gear 142 and is coupled by means of a speed reducer 146 to the shaft of a pivot drive motor 148 mounted on the scan drive housing 104.

The pivot drive assembly 54 is utilized during loading and unloading of wafers to pivot the disk from the approximately vertical implant position to the approximately horizontal load/unload position. After exchange of wafers, the disk 40 is pivoted back to the implant position. In order to load or unload wafers from the disk 40, the scan motor 128 is stopped with the scan arm assembly 44 horizontal. The pivot drive motor 148 is then energized, causing rotation of the worm 144 and worm gear 142. Scan arm 86 and disk drive assembly 50 thereby rotate about axis C, causing the disk 40 to pivot to the load/unload position (shown in FIG. 10 in phantom lines). In the load/unload position, one wafer mounting site 42 at a time is positioned adjacent to the wafer transfer system 38 which loads and unloads wafers 39 from that site. The wafers 39 are moved between cassettes 150 (FIGS. 1 and 10) and the wafer mounting site 42 by an articulated arm 152. After wafer exchange is completed at one wafer mounting site 42, the disk drive motor 74 indexes the disk 40 to the next wafer mounting site 42, and the wafer exchange process is repeated. A suitable wafer transfer system is disclosed in application Ser. No. 135,568 filed Dec. 21, 1987, now U.S. Pat. No. 4,836,733, which is hereby incorporated by reference. After the wafers have been exchanged on all of the mounting sites 42, the pivot drive motor 148 is energized in the opposite direction, and the disk 40 is pivoted around axis C to the implant position. During operation of the pivot drive motor 148, the scan arm housing 88 remains stationary, and the scan arm 86 rotates in ball bearings 90 and 92.

As noted above, it is desirable that the ion implanter have the capability of changing the implant angle, the angle of incidence of ion beam 20 on the wafer. Typically, implant angles range from normal incidence to about 10° from normal incidence. In accordance with one aspect of the present invention, the implant angle can be changed by a single adjustment that is made external to the vacuum chamber 30 without opening or venting vacuum chamber 30. Before considering implant angle adjustment, it is useful to discuss the interrelationship between the disk rotation axis A, the scan axis B and the axis of the ion beam 20.

Figure 14:
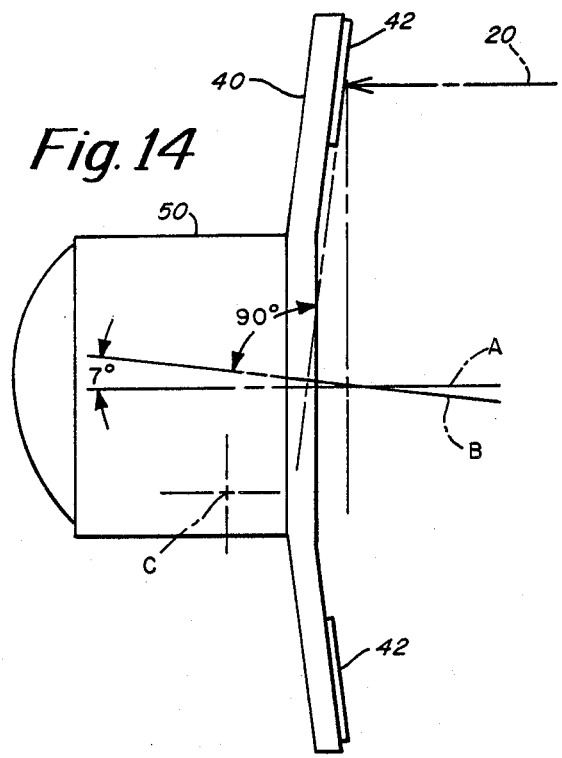
FIG. 14 is a schematic diagram illustrating the interrelationship of the axes of movement of the scanning apparatus.

It is desirable during scanning to maintain the point of incidence of the ion beam 20 on the wafer surface fixed along the ion beam axis in order to insure dose uniformity. This condition is met by establishing the scan axis B perpendicular to the plane of the wafer mounting site 42 that is intercepting the ion beam 20. In a preferred embodiment, the wafer mounting sites 42 are oriented at an angle of 7° relative to the plane of disk 40, and the scan axis B is oriented at an angle of 7° relative to the disk rotation axis A, as shown in FIG. 14. In FIGS. 1–13, the angle between the A axis and the B axis is omitted for clarity. The relationship between axes A and B remains fixed when the implant angle is changed. From FIG. 14 it can be seen that as the disk 40 is scanned about the B axis, that mounting site 42 which is intercepting the ion beam 20 moves transversely in its own plane.

The angle between the A and B axes is established by an adjustable stop assembly 160 (FIG. 5) mounted to the scan arm 86 and to the scan drive housing 104. The adjustable stop assembly 160 includes a stop lever 162 radially mounted at a predetermined angular position on the scan arm 86 and an adjustable stop 164 mounted on the scan drive housing 104. As the scan arm 86 rotates about axis C, the stop lever 162 and the stop 164 contact each other when the disk 40 reaches the implant position. The stop 164 is an axially adjustable screw which permits the angle between the A and B axes to be accurately adjusted so that the scan axis B is perpendicular to the plane of the wafer which is intercepting ion beam 20. The pivot drive motor 148 is preferably a type, such as an a.c. servomotor, which provides torque sensing. When the stop lever 162 rotates into contact with stop 164, the torque supplied by motor 148 increases. The increased torque is sensed, and the motor is deenergized. As a result, when the disk 40 is returned to the implant position, the desired angle between the disk rotation axis A and the scan axis B is established, regardless of implant angle adjustment, as described hereinafter.

The load/unload position of the disk 40 is established by a stop assembly 170 mounted on the disk drive housing 70 and on the access door 60, as shown in FIGS. 4 and 10. A stop lever 172 is mounted with a radial orientation on the second portion 70b of disk drive housing 70. A stop 174 is mounted to access door 60. The stop lever 172 and the stop 174 are positioned to contact each other when the disk 40 rotates about axis C to a position wherein the wafer mounting site 42 at the top of disk 40 is horizontal and is aligned with the wafer transfer system. The stop assembly 170 establishes a fixed relationship between the disk 40 and the wafer transfer system 38, regardless of the implant angle adjustment. Thus, adjustment of the wafer transfer system is not necessary when the implant angle is changed. A stop lever 166 (FIG. 5) is mounted to housing 104 so as to contact stop lever 162 at a second angular position corresponding to the load/unload position. The stop lever 166 causes the motor 148 to be deenergized when the disk 40 has almost reached the load/unload position.

The implant angle is changed by rotating virtually the entire scanning apparatus 36 around the axis C. The scan support 66 is mounted to access door 60 by a plurality of spring-loaded clamps 180 (FIGS. 6 and 8). When it is desired to change the implant angle, the spring-loaded clamps 180 are loosened, and the scan support 66 is rotated about the axis C by operation of a screw adjustment assembly 182. The spring-loaded clamps 180 move in elongated, arc-shaped slots 183. The scan support 66 carries with it the scan drive assembly 52, the scan arm assembly 44, the disk drive assembly 50 and the disk 40 so that the angle of the wafer mounting site 42 relative to ion beam 20 is changed. The exact implant angle is determined by graduations 184 on a mounting bracket 185 attached to the access door 60, and on the scan support 66. When the desired implant angle is reached, the spring-loaded clamps 180 are retightened. Thus, the implant angle is adjusted without the necessity of opening or venting the vacuum chamber 30, and the desired relationship between disk rotation axis A and scan axis B is maintained constant. An inclinometer 187 (FIG. 7) attached to scan support 66 provides a signal representative of the implant angle to the ion implantation system computer.

Figure 9:
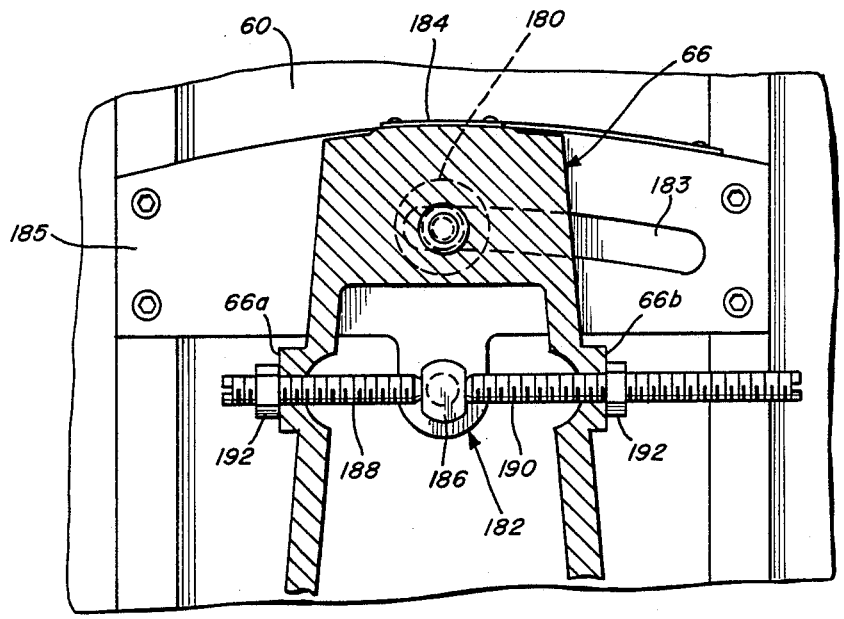
FIG. 9 is a partial cross-sectional view of the scanning apparatus taken along the line 9—9 of FIG. 8 showing the implant angle adjustment.

The adjustment assembly 182 is illustrated in FIG. 9. A pin 186, having flat sides, is attached to the mounting bracket 185. An adjustment screw 188 is threaded through a first portion 66a of the scan support 66 and abuts one side of pin 186. An adjustment screw 190 is threaded through a second portion 66b of scan support 66 and abuts against the opposite side of pin 186. When the spring loaded clamps 180 are loosened, the implant angle is adjusted by retracting one of the adjustment screws 188 or 190 and advancing the other adjustment screw, so that the scan support 66 is caused to rotate about axis C. The implant angle is read from graduations 184. When the desired implant angle is reached, both adjustment screws 188, 190 are tightened against pin 186 and check nuts 192 are tightened against scan support 66 to maintain adjustment screws 188 and 190 in position. Then, the spring-loaded clamps 180 are tightened. The adjustment of implant angle without opening or venting the vacuum chamber 30 provides a considerable time saving over prior art methods of implant angle adjustment.

While there has been shown and described what is at present considered the preferred embodiments of the present invention, it will be obvious to those skilled in the art that various changes and modifications may be made therein without departing from the scope of the invention as defined by the appended claims.

What is claimed is:

1. Apparatus for workpiece translation in an ion beam treatment system, comprising:
   a vacuum envelope defining a vacuum chamber;
   means for generating an ion beam;
   a disk including a plurality of workpiece mounting sites, said disk being positioned within said vacuum chamber so that one of said workpiece mounting sites intercepts said ion beam;
   disk drive means for rotating said disk about a disk rotation axis so that said workpiece mounting sites successively intercept said ion beam;
   scan arm means for supporting said disk and said disk drive means within said vacuum chamber, said scan arm means extending through said vacuum envelope and being mounted for movement around a scan axis;
   scan drive means for scanning said scan arm means about said scan axis so that said disk and said disk drive means move along an arc-shaped path in said vacuum chamber; and
   pivot drive means for pivoting said scan arm means, said disk drive means and said disk about a pivot axis to and between a treatment position and a load/unload position for loading and unloading of workpieces.

2. Workpiece translation apparatus as defined in claim 1 wherein each workpiece mounting site includes a generally planar workpiece mounting surface and wherein said scan axis is substantially perpendicular to the workpiece mounting surface of said one of said workpiece mounting sites that intercepts the ion beam.

3. Workpiece translation apparatus as defined in claim 1 wherein said vacuum envelope includes an access door and wherein said apparatus further includes scan support means attached to said access door for mounting said scan drive means so that said scan drive means, said scan arm means, said disk drive means and said disk are supported from and carried by said access door.

4. Workpiece translation apparatus as defined in claim 3 including means for carrying said access door to and between a closed operational position and an open access position.

5. Workpiece translation apparatus as defined in claim 4 wherein said carrying means comprises a pair of rails.

6. Workpiece translation apparatus as defined in claim 1 wherein said disk drive means is positioned on said disk rotation axis and is supported by said scan arm means.

7. Workpiece translation apparatus as defined in claim 6 wherein said disk drive means includes a sealed disk drive housing enclosing a disk drive motor and said scan arm means includes a hollow portion for coupling the interior of said disk drive housing to the external atmosphere, whereby the interior of said disk drive housing is maintained at ambient pressure and is isolated from said vacuum chamber.

8. Workpiece translation apparatus as defined in claim 3 wherein said scan drive means comprises
   a scan drive housing connected to said scan arm assembly,
   a ball screw assembly mounted on said scan drive housing, including a ball screw having one end in abutting contact with said scan support means and a nut mounted for rotational movement in said scan drive housing, and
   a scan drive motor coupled to said nut for advancing said nut on said ball screw, whereby said scan drive means and said scan arm means pivot around said scan axis when said scan drive motor is energized.

9. Workpiece translation apparatus as defined in claim 8 wherein said scan support means includes a roller mounted so as to contact said one end of said ball screw.

10. Workpiece translation apparatus as defined in claim 3 wherein said scan drive means comprises
    a ball screw assembly including a ball screw having one end in abutting contact with one of said scan support means and said scan drive means and a nut mounted for rotational movement to the other of said scan support means and said scan drive means, and
    a scan drive motor coupled to said nut for advancing said nut on said ball screw, whereby said scan drive means and said scan arm means pivot around said scan axis when said scan drive motor is energized.

11. Workpiece translation apparatus as defined in claim 3 wherein said disk drive means is positioned within said vacuum chamber on said disk rotation axis and is supported by said scan arm means and wherein said scan arm means comprises a scan arm housing on said pivot axis and a scan arm that is coaxial with said scan arm housing, said scan arm being mounted for rotation around said pivot axis relative to said scan arm housing.

12. Workpiece translation apparatus as defined in claim 11 wherein said pivot drive means comprises a pivot drive motor and means for coupling said pivot drive motor to said scan arm so that said scan arm, said disk drive means and said disk are pivoted around said pivot axis when said pivot drive motor is energized.

13. Workpiece translation apparatus as defined in claim 11 wherein said scan arm means extends through an opening in said access door and wherein said opening is sealed with a bellows having one end sealed to said scan arm means.

14. Workpiece translation apparatus as defined in claim 3 wherein each workpiece mounting site includes a generally planar workpiece mounting surface and wherein said scan axis is substantially perpendicular to the workpiece mounting surface of said one of said workpiece mounting sites that intercepts the ion beam.

15. Workpiece translation apparatus as defined in claim 14 further including implant angle adjustment means for rotating said scan support means around said pivot axis without opening or venting said vacuum chamber, whereby the angle of incidence of said ion beam on said workpiece mounting surface is changed while maintaining said workpiece mounting surface substantially perpendicular to said scan axis.

16. Workpiece translation apparatus as defined in claim 15 wherein said disk drive means is positioned within said vacuum chamber on said disk rotation axis and is supported by said scan arm means and wherein said scan arm means comprises a scan arm housing on said pivot axis and a scan arm that is coaxial with said scan arm housing, said scan arm being mounted for rotation around said pivot axis relative to said scan arm housing.

17. Workpiece translation apparatus as defined in claim 16 further including stop means for establishing the relative alignment of said disk rotation axis and said scan axis, said stop means including a stop lever radially mounted to said scan arm and a stop mounted to one of said scan drive means and said scan arm housing so that said stop lever and said stop contact each other when said disk rotation axis and said scan axis have the desired relative orientation.

18. Workpiece translation apparatus as defined in claim 16 further including stop means for establishing the alignment of said disk in said load/unload position, said stop means including a stop lever mounted to said disk drive means and a stop mounted to said access door so that said stop lever and said stop contact each other when said disk reaches the desired load/unload position.

19. Apparatus for wafer translation in an ion implantation system, comprising:
a vacuum envelope defining a vacuum chamber;
means for generating an ion beam;
a disk including a plurality of wafer mounting sites each including a generally planar wafer mounting surface, said disk being positioned within said vacuum chamber so that one of said wafer mounting sites intercepts said ion beam;
disk drive means for rotating said disk about a disk rotation axis so that said wafer mounting sites successively intercept said ion beam;
scan arm means for supporting said disk and said disk drive means within said vacuum chamber, said scan arm means being mounted for movement around a scan axis; and
scan drive means for scanning said scan arm means about said scan axis so that said disk and said disk drive means move along an arc-shaped path in said vacuum chamber, said wafer mounting surfaces each being oriented at a predetermined angle relative to a plane perpendicular to said disk rotation axis and said scan axis being oriented at said predetermined angle relative to said disk rotation axis so that said scan axis is perpendicular to the wafer mounting surface of said one of said wafer mounting sites that intercepts said ion beam.

20. Wafer translation apparatus as defined in claim 19 wherein said vacuum envelope includes an access door and wherein said apparatus further includes scan support means attached to said access door for mounting said scan drive means so that said scan drive means, said scan arm means, said disk drive means and said disk are supported from and carried by said access door.

21. Wafer translation apparatus as defined in claim 20 including means for carrying said access door to and between a closed operational position and an open access position.

22. Wafer translation apparatus as defined in claim 19 wherein said disk drive means is positioned on said disk rotation axis and is supported by said scan arm means.

23. Wafer translation apparatus as defined in claim 22 wherein said disk drive means includes a sealed disk drive housing enclosing a disk drive motor and said scan arm means includes a hollow portion for coupling the interior of said disk drive housing to the external atmosphere, whereby the interior of said disk drive housing is maintained at ambient pressure and is isolated from said vacuum chamber.

24. Wafer translation apparatus as defined in claim 20 wherein said scan drive means comprises
a ball screw assembly including a ball screw having one end in abutting contact with one of said scan support means and said scan drive means and a nut mounted for rotational movement to the other of said scan support means and said scan drive means, and
a scan drive motor coupled to said nut for advancing said nut on said ball screw, whereby said scan drive means and said scan arm means pivot around said scan axis when said scan drive motor is energized.

25. Wafer translation apparatus as defined in claim 20 further including implant angle adjustment means for rotating said scan support means around a longitudinal axis of said scan arm means without opening or venting said vacuum chamber whereby the angle of incidence of said ion beam on said wafer mounting surface is changed while maintaining said wafer mounting surface substantially perpendicular to said scan axis on the axis of said ion beam.

26. Wafer translation apparatus as defined in claim 25 further including pivot drive means for pivoting said scan arm means, said disk drive means and said disk about said longitudinal axis thereof to and between an implant position and a load/unload position.

27. Apparatus for wafer translation in an ion implantation system, comprising:
a vacuum envelope defining a vacuum chamber;
means for generating an ion beam;
a disk including a plurality of wafer mounting sites each including a generally planar wafer mounting surface, said disk being positioned within said vacuum chamber so that said wafer mounting sites successively intercept said ion beam as said disk is rotated about a disk rotation axis;
disk drive means for rotating said disk said disk rotation axis;
scan arm means for supporting said disk and said disk drive means within said vacuum chamber, said scan arm means extending through said vacuum envelope and being mounted for movement around a scan axis located outside said vacuum envelope;
scan drive means for scanning said scan arm means about said scan axis so that said disk and said disk drive means move along an arc-shaped path in said vacuum chamber and;
implant angle adjustment means for changing the angle of incidence of said ion beam on said wafer mounting surface including means for rotating said disk, said disk drive means and said scan arm means around an axis parallel to the plane of said disk without opening said vacuum chamber.

28. Wafer translation apparatus as defined in claim 27 wherein said scan axis is substantially perpendicular to the wafer mounting surface of said one of said wafer mounting sites that intercepts the ion beam.

29. Wafer translation apparatus as defined in claim 27 wherein said vacuum envelope includes an access door and wherein said apparatus further includes scan support means attached to said access door for supporting said scan drive means, said scan arm means, said disk drive means and said disk.

30. Wafer translation apparatus as defined in claim 29 wherein said scan arm means extends through openings in said access door and said scan support means into said vacuum chamber.

31. Wafer translation apparatus as defined in claim 30 wherein said implant angle adjustment means includes means for rotating said scan support means relative to said access door.

32. Wafer translation apparatus as defined in claim 29 including means for carrying said access door to and between a closed operational position and an open access position.

33. Apparatus for wafer translation in an ion implantation system, comprising:
 a vacuum envelope defining a vacuum chamber;
 means for generating an ion beam;
 a disk including a plurality of wafer mounting sites each including a generally planar wafer mounting surface, said disk being positioned within said vacuum chamber so that said wafer mounting sites successively intercept said ion beam as said disk is rotated about a disk rotation axis;
 disk drive means for rotating said disk about said disk rotation axis;
 scan arm means for supporting said disk and said disk drive means within said vacuum chamber, said scan arm means extending through said vacuum envelope and being mounted for movement around a scan axis located outside said vacuum envelope;
 scan drive means for scanning said scan arm means about said scan axis so that said disk and said disk drive means move along an arc-shaped path in said vacuum chamber and;
 said vacuum envelope including an access door having scan support means mounted thereto for supporting said scan drive means so that said scan drive means, said scan arm means, said disk drive means and said disk are carried by said access door to and between a closed operational position and an open access position.

34. Wafer translation apparatus as defined in claim 33 further including pivot drive means for pivoting said scan arm means, said disk drive means and said disk about a pivot axis parallel to the plane of said disk to and between an implant position and a load/unload position.

35. Wafer translation apparatus as defined in claim 33 wherein said scan axis is substantially perpendicular to the wafer mounting surface of said one of said wafer mounting sites that intercepts the ion beam.

36. Apparatus for workpiece translation, comprising:
 a vacuum envelope defining a vacuum chamber;
 a disk including a plurality of workpiece mounting sites, said disk being positioned within said vacuum chamber;
 disk drive means for rotating said disk about a disk rotation axis;
 scan arm means for supporting said disk and said disk drive means within said vacuum chamber, said scan arm means extending through said vacuum envelope and being mounted for movement around a scan axis;
 scan drive means for scanning said scan arm means about said scan axis so that said disk and said disk drive means move along an arc-shaped path in said vacuum chamber; and
 pivot drive means for pivoting said scan arm means, said disk drive means and said disk about a pivot axis to and between a treatment position and a load/unload position for loading and unloading of workpieces.

* * * * *